United States Patent
Yan et al.

(10) Patent No.: US 12,422,459 B2
(45) Date of Patent: Sep. 23, 2025

(54) SEMICONDUCTOR DEVICE PACKAGE WITH INTERNAL MAGNETIC SHIELD FOR HALL SENSOR

(71) Applicant: Texas Instruments Incorporated, Dallas, TX (US)

(72) Inventors: Yi Yan, San Jose, CA (US); Dok Won Lee, Mountain View, CA (US); Hank Ming Sung, Sachse, TX (US); Kenji Otake, Nagano (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 150 days.

(21) Appl. No.: 18/499,086

(22) Filed: Oct. 31, 2023

(65) Prior Publication Data

US 2025/0138054 A1    May 1, 2025

(51) Int. Cl.
| | | |
|---|---|---|
| G01R 15/20 | (2006.01) | |
| G01R 19/00 | (2006.01) | |
| H10N 52/01 | (2023.01) | |
| H10N 52/80 | (2023.01) | |

(52) U.S. Cl.
CPC ....... G01R 15/202 (2013.01); G01R 19/0092 (2013.01); H10N 52/01 (2023.02); H10N 52/80 (2023.02)

(58) Field of Classification Search
CPC .. G01R 15/202; G01R 19/0092; H10N 52/01; H10N 52/80
See application file for complete search history.

(56) References Cited

U.S. PATENT DOCUMENTS

| | | | | |
|---|---|---|---|---|
| 9,035,422 B2* | 5/2015 | Khanolkar | .......... | H01F 27/2804 257/531 |
| 9,508,633 B2* | 11/2016 | Herbsommer | .......... | H01L 24/41 |
| 2006/0063306 A1* | 3/2006 | Choi | .................. | H01L 23/3128 257/E23.092 |
| 2009/0039483 A1* | 2/2009 | Chang | ................. | H01L 23/4334 165/185 |
| 2013/0049746 A1* | 2/2013 | Strutz | .................... | G01R 33/07 257/E29.323 |

* cited by examiner

Primary Examiner — Reena Aurora
(74) Attorney, Agent, or Firm — Dawn Jos; Frank D. Cimino

(57) ABSTRACT

A described example includes: a heat slug coupled to a package substrate, the heat slug configured to conduct a current between terminals of the package substrate; a first magnetic shield mounted to a top surface of the package substrate, the first magnetic shield including a die mount area; a semiconductor die flip chip mounted to the die mount area; a second magnetic shield mounted to the package substrate, the second magnetic shield having a cantilever portion extending over a portion of the semiconductor die including a Hall element; electrical connections of wire bonds or ribbon bonds between bond pads of the semiconductor die and leads on the package substrate; and mold compound covering the electrical connections, the semiconductor die, the first magnetic shield, and the second magnetic shield, while a portion of the heat slug is exposed forming a thermal pad for a semiconductor device package.

20 Claims, 18 Drawing Sheets

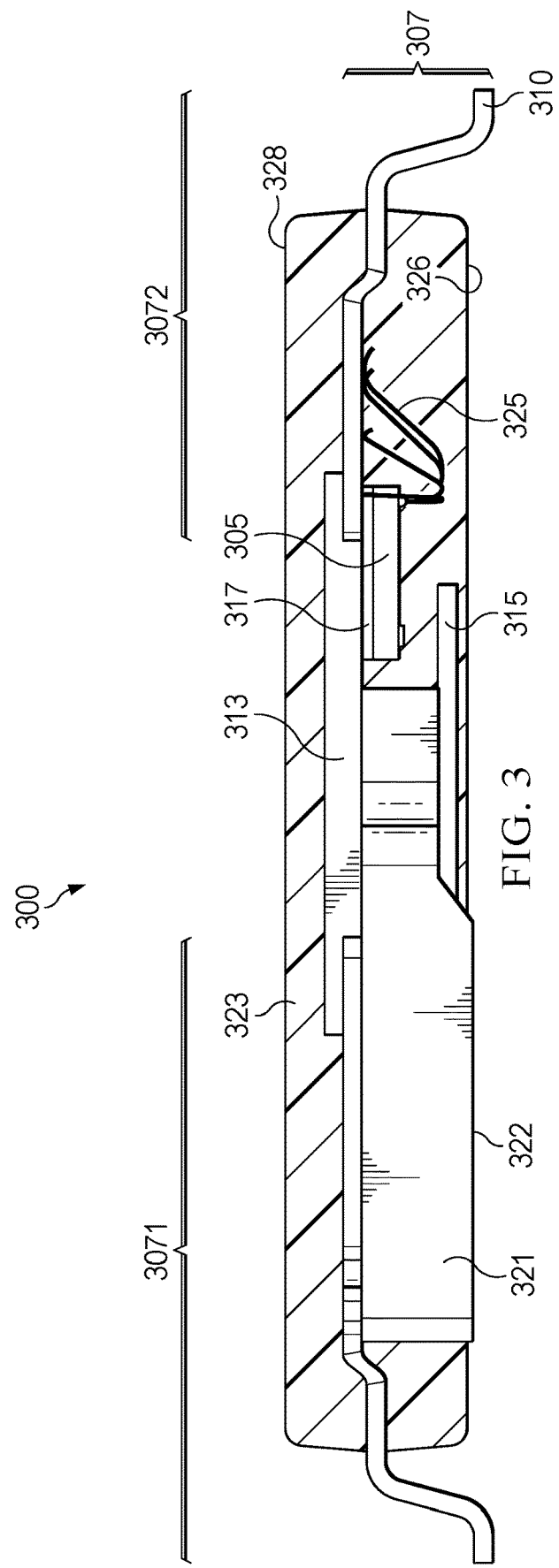

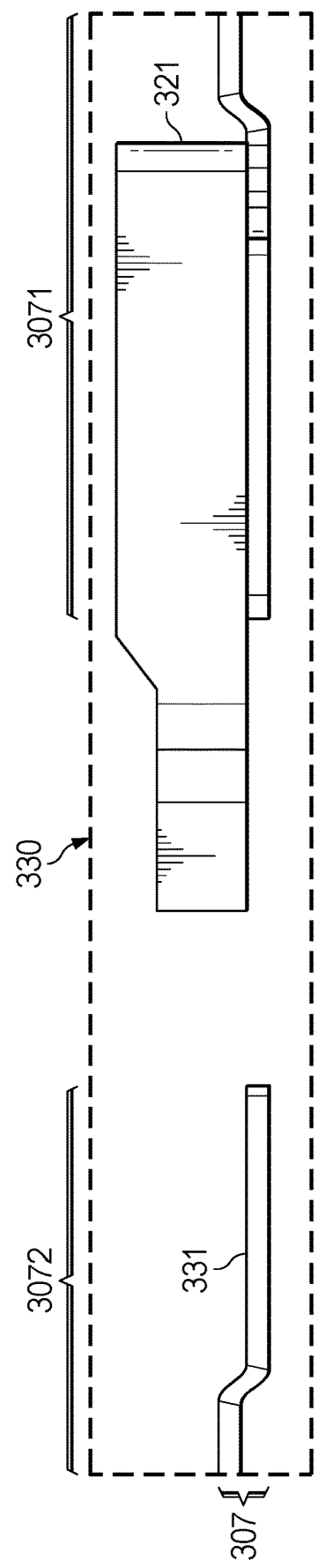

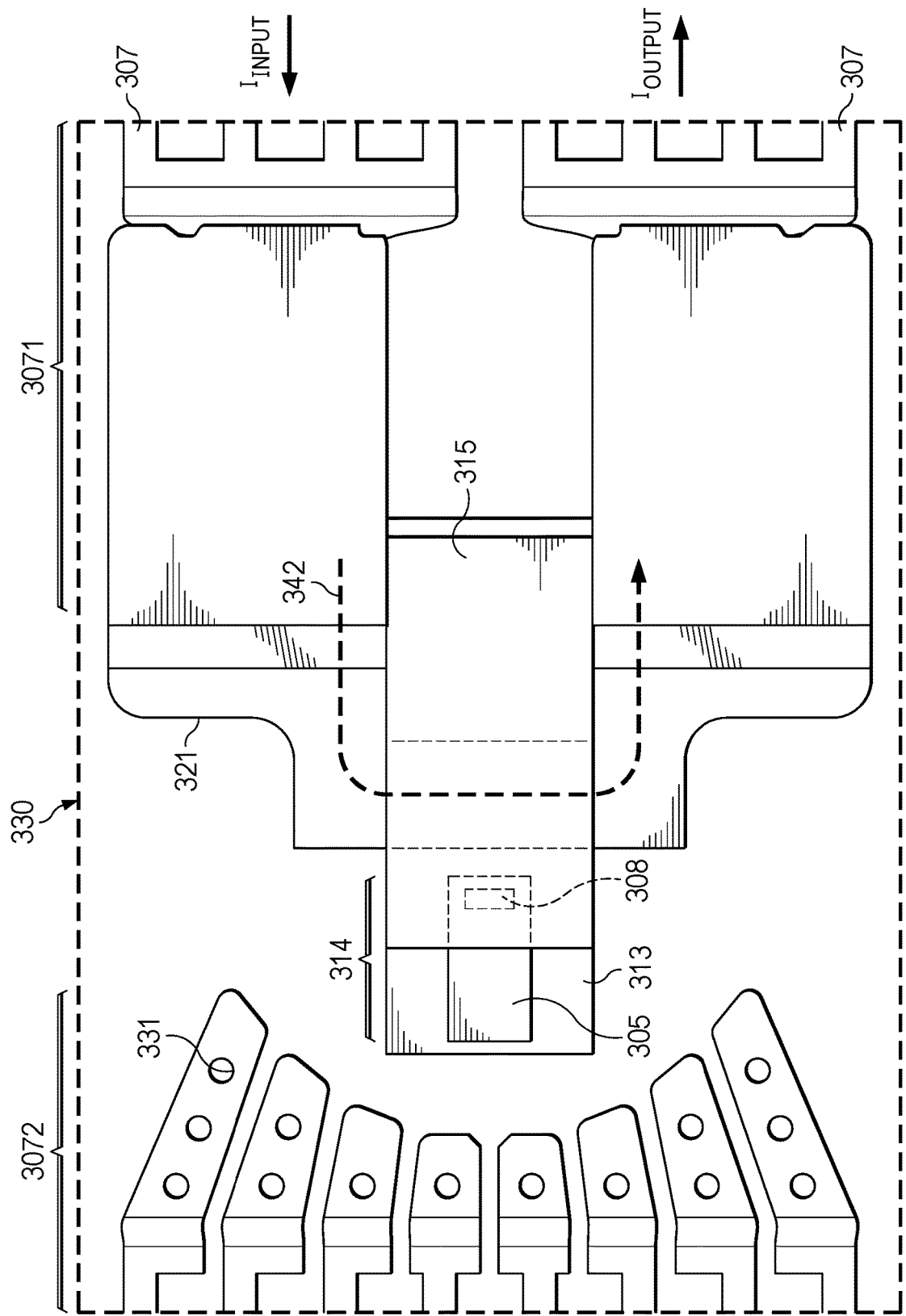
FIG. 4DDD

SEMICONDUCTOR DEVICE PACKAGE WITH INTERNAL MAGNETIC SHIELD FOR HALL SENSOR

TECHNICAL FIELD

This disclosure relates generally to semiconductor device packages with semiconductor dies including Hall sensors.

BACKGROUND

Semiconductor devices for magnetic sensing include Hall effect sensors with circuitry. Magnetic sensing can be used for motor control, position sensing, automation, current sensing and other applications. Hall effect sensors integrated in semiconductor devices can be formed by doping regions to include carriers that are sensitive to a magnetic field. A voltage proportional to a magnetic field is output by the Hall sensor while a current is applied to the Hall sensor. The Hall sensor is most sensitive to magnetic fields normal to a plane in the Hall sensor.

Hall effect current sensing is increasingly used in the control of high voltage motors and in power systems. Sensing of currents of greater than 100 Amperes is increasingly needed. Solutions for semiconductor devices with Hall sensors for these applications currently involve expensive, combined, and/or bulky semiconductor packages. Examples include package-in-package solutions, where a packaged Hall sensor semiconductor device is placed in a second module with a magnetic core, and the components are again packaged. Other known solutions use custom semiconductor packages for Hall sensors. Non-standard footprints for the packaged Hall sensors increase assembly costs.

An aspect of a Hall sensor is the need for magnetic shielding. Because the Hall sensor uses a magnetic field caused by a current flowing through a metal conductor to sense the current, stray magnetic fields in the environment can adversely impact sensing and result in error in the current measurements. To improve performance, magnetic shielding and magnetic concentrators are used. Magnetic concentrators can increase the Hall sensor performance by making the magnetic field to be sensed better align with the plane of the Hall sensor.

Magnetic shield materials for use in semiconductor processes can include magnetic materials. These magnetic materials may not be easily integrated in a semiconductor die using semiconductor device processing, making forming magnetic shields during the manufacture of semiconductor dies in semiconductor processes expensive. A reliable and robust semiconductor device package integrating a Hall current sensor device with magnetic shields at low costs is needed.

SUMMARY

In a described example, a method of forming a semiconductor device package includes forming a package substrate having a board side surface and an opposite top surface, and having a heat slug coupled to the package substrate, the heat slug configured to conduct a current between terminals of the package substrate; mounting a first magnetic shield to the package substrate, the first magnetic shield comprising a die mount area facing the board side surface, the die mount area exposed from the package substrate and the heat slug; mounting a semiconductor die having a Hall element on the die mount area, the semiconductor die flip chip mounted and facing away from the board side surface of the package substrate; mounting a second magnetic shield to the package substrate and the heat slug, the second magnetic shield having a cantilever portion that extends over a portion of the semiconductor die including the Hall element, while bond pads on the semiconductor die remain exposed from the second magnetic shield; forming electrical connections of wire bonds or ribbon bonds between the bond pads of the semiconductor die and leads on the package substrate; and covering the electrical connections, the semiconductor die, and portions of the package substrate, the first magnetic shield, and the second magnetic shield with mold compound, while a portion of the heat slug is exposed from the mold compound forming a thermal pad for the semiconductor device package.

In another described example, an apparatus includes: a package substrate having a board side surface and an opposite top surface, and a heat slug coupled to the package substrate, the heat slug configured to conduct a current between terminals of the package substrate. A first magnetic shield is mounted to the top surface of the package substrate, the first magnetic shield including a die mount area facing the board side surface, the die mount area in an opening exposed from the package substrate and the heat slug. A semiconductor die having a Hall element is mounted to the die mount area, the semiconductor die flip chip mounted and facing away from the board side surface of the package substrate. A second magnetic shield is mounted to the package substrate and the heat slug, the second magnetic shield having a base portion and having a cantilever portion extending over a portion of the semiconductor die including the Hall element, while bond pads on the semiconductor die remain exposed from the second magnetic shield. Electrical connections are formed of wire bonds or ribbon bonds between bond pads of the semiconductor die and leads on the package substrate. Mold compound covers the electrical connections, the semiconductor die, portions of the package substrate, the first magnetic shield, and the second magnetic shield, while a portion of the heat slug is exposed from the mold compound to forming a thermal pad for a semiconductor device package.

In a further described example, a Hall current sensor device includes: a leadframe having a first set of leads in a high voltage section and second set of leads in a low voltage section electrically isolated from the high voltage section, the leadframe having a board side surface and an opposite top surface; a heat slug coupled to the first set of leads of the high voltage section, the heat slug configured to conduct a current between terminals formed from the first set of leads of the high voltage section; a first magnetic shield mounted to the top surface of the leadframe and comprising a die mount area in an opening exposed from the leadframe and from the heat slug; a semiconductor die having a Hall element mounted to the die mount area, the semiconductor die flip chip mounted and facing away from the board side surface of the leadframe; a second magnetic shield mounted to the heat slug, the second magnetic shield having a base portion and having a cantilever portion extending over a portion of the semiconductor die including the Hall element, while bond pads on the semiconductor die remain exposed from the second magnetic shield; electrical connections comprising wire bonds or ribbon bonds between the bond pads of the semiconductor die and the second set of leads on the low voltage section of the leadframe; and mold compound covering the electrical connections, the semiconductor die, portions of the leadframe, the first magnetic shield, and the second magnetic shield, while a portion of the heat slug is exposed from the mold compound forming a thermal pad for a semiconductor device package.

BRIEF DESCRIPTION OF THE DRAWINGS

FIG. 3 illustrates, in a cross-sectional view, a semiconductor device package of an arrangement.

DETAILED DESCRIPTION

Figure 1A:
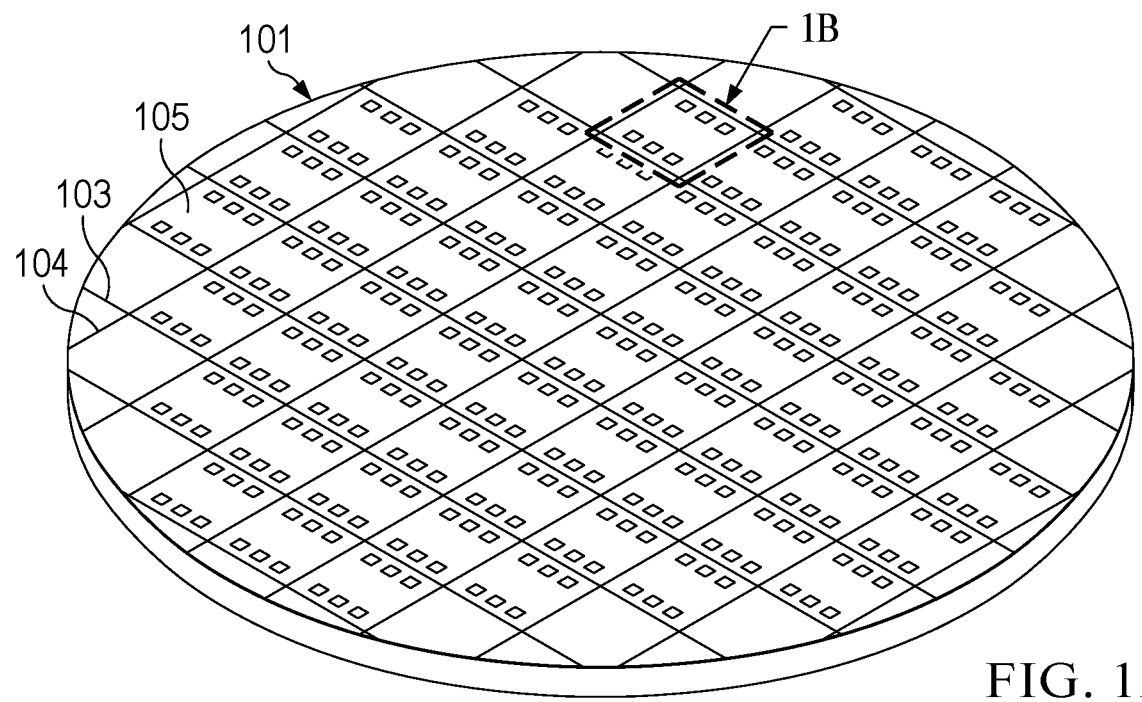
FIGS. 1A-AB illustrate a semiconductor wafer and an individual semiconductor die, respectively.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "semiconductor device package" is used herein. A semiconductor device package has at least one semiconductor die electrically coupled to terminals, and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. Additional components such as passives can be included in the packaged electronic device. The semiconductor die is mounted to a package substrate that provides conductive leads; a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive leadframes, which can be formed from copper, aluminum, stainless steel, steel and alloys such as Alloy 42 and copper alloys. The leadframes can be provided in strips or arrays. The conductive leadframes can be provided as a panel with strips or arrays of unit device portions in rows and columns. Semiconductor dies can be placed on respective unit device portions within the strips or arrays. A semiconductor die can be placed on a die mount area for each packaged device, and die attach or die adhesive can be used to mount the semiconductor dies to the die mount areas. In wire bonded packages, bond wires can couple bond pads on the semiconductor dies to the leads of the leadframes. The leadframes may have plated portions in areas designated for wire bonding, for example silver plating can be used. After the bond wires are in place, a portion of the package substrate, the semiconductor die, and at least a portion of the die pad can be covered with a protective material such as a mold compound.

In the example arrangements, a leadframe with isolated lead portions can be used. The leadframe has a high voltage portion with a first set of leads configured for coupling to high voltage signals or supplies, such as at voltages greater than 20 Volts. The leadframe has a low voltage portion with a second set of leads configured for coupling to low voltage signals such as logic level signals at voltages of less than 20 Volts. The high voltage portion and the low voltage portion are isolated electrically from one another.

In packaging semiconductor devices, mold compound may be used to partially cover a package substrate, to cover the semiconductor die, and to cover the electrical connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in-line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board, and form a mounting surface. Gull wing leads, J-leads, and other lead shapes can be used. A small outline integrated circuit (SOIC) package with leads can be used with the arrangements. Wide SOIC packages can be used with the arrangements. Dual in-line packages (DIPs) can be used. In DIPs, the leads end in pin shaped portions that can be inserted into conductive holes formed in a circuit board, and solder is used to couple the leads to the conductors within the holes.

The term "magnetic material" is used herein. A magnetic material useful with the arrangements includes iron oxide, $Fe_2O_3$, useful examples include nickel ferrite (NiFe), nickel zinc ferrite (NiZnFe), and manganese zinc ferrite (MnZnFe). Ferrites are ferrimagnetic, and become magnetized in the presence of a magnetic field. The term "magnetic shield" is used herein. In the arrangements, magnetic shields are formed by integrating a magnetic layer of soft ferrite material over or under a semiconductor die including one or more Hall sensors within a semiconductor device package. The integral magnetic shields prevent stray magnetic fields from affecting the Hall element sensors on the semiconductor die. A current flowing through a leadframe in the semiconductor device package generates a local magnetic field with which the Hall sensors are used to measure the current. The integral magnetic shields prevent external magnetic fields from introducing unwanted error into the current measurements.

The term "cantilever portion" is used herein. In an example arrangement, a magnetic shield within a semiconductor device package has a cantilever portion that extends in a horizontal direction from a base, the cantilever portion is unsupported along its length and extends over a Hall element on a semiconductor die, while a portion of the semiconductor die is not covered by the cantilever portion of the magnetic shield.

The term "heat slug" is used herein. A heat slug is a conductor material that conducts heat. In the arrangements a heat slug is used to carry a current that can be sensed. The heat slug is mounted to and electrically coupled to the high voltage portion of a leadframe and forms part of a current path between an input terminal or terminals and an output terminal or terminals configured to be coupled to a high voltage at the input terminal and to carry the current. The heat slug in the arrangements can be a "C" shaped conductor from a plan view. The heat slug carries the current to a position within the semiconductor package that is proximate to a semiconductor die that includes a Hall element. The Hall element operates by sensing the magnetic field generated by the current flowing through the heat slug. In an example arrangement a copper heat slug that is thicker than the leadframe is used, and the copper heat slug has a board side surface that is exposed from a mold compound body of the semiconductor device package for transferring heat from the semiconductor device package.

Figure 1B:
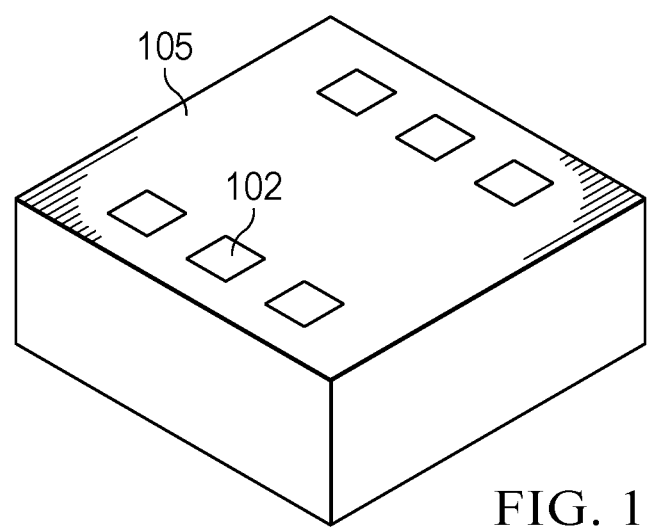
FIG. 1C illustrates, in a circuit block diagram, an application for a Hall sensor of an arrangement.

FIGS. 1A-1B illustrate steps used in forming semiconductor dies such as used with the arrangements for wire bonding. In FIG. 1A, a semiconductor wafer 101 is shown with an array of semiconductor dies 105 arranged in rows and columns.

The semiconductor dies 105 are formed using manufacturing processes in a semiconductor manufacturing facility, including ion implantation for carrier doping, anneals, oxidation, dielectric and conductor deposition, photolithography, pattern, etch, chemical mechanical polishing (CMP), electroplating, and other processes for making semiconductor devices. Devices are formed on a device side surface of the semiconductor dies. Scribe lanes 103 and 104, which are perpendicular to one another and which run in parallel groups across the semiconductor wafer 101, separate the rows and columns of the completed semiconductor dies 105, and provide areas for dicing the wafer to separate the semiconductor dies 105 from one another.

FIG. 1B illustrates a single semiconductor die 105, with bond pads 102, which are conductive pads that are electrically coupled to devices (not shown for simplicity) formed in the semiconductor dies 105. The semiconductor dies 105 are separated from semiconductor wafer 101 by wafer dicing, or are singulated from one another, using the scribe lanes 103, 104 (see FIG. 1A). Wafer dicing can be done by a mechanical saw or by laser cutting along the scribe lanes. The semiconductor die 105 shown in FIG. 1B includes a Hall element (not shown), or more than one Hall element. In an example arrangement the Hall elements are configured as a current sensor.

Figure 1C:
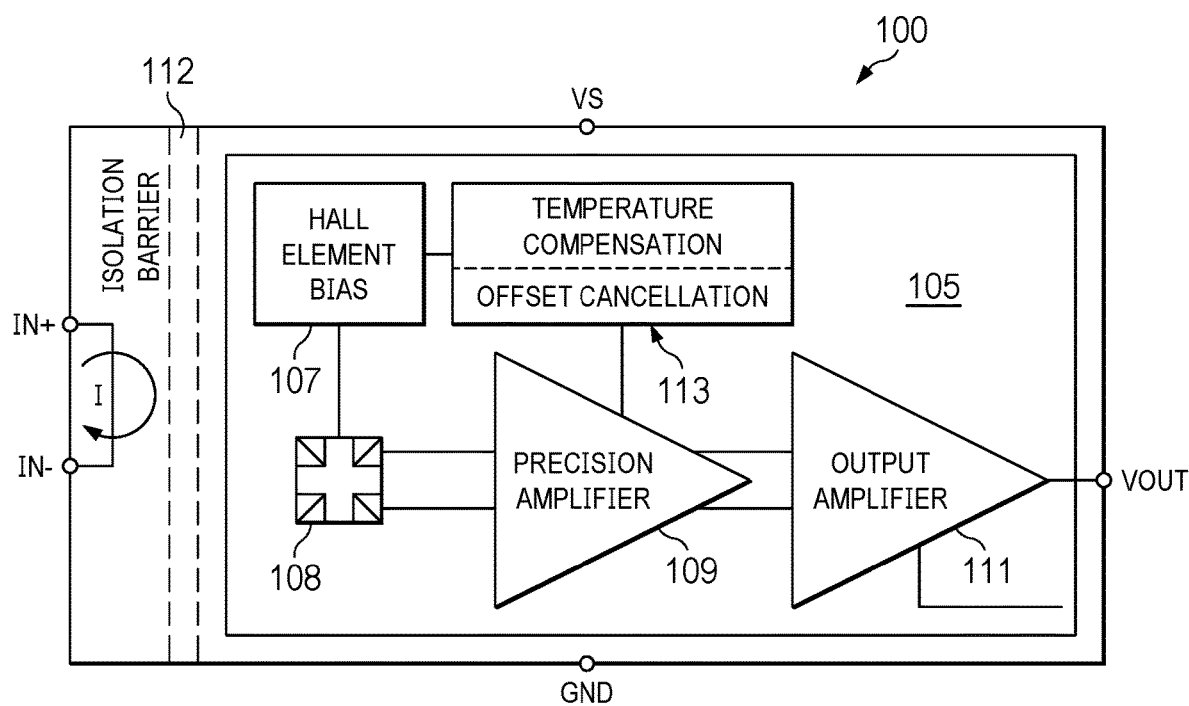

FIG. 1C is a circuit block diagram for an example semiconductor device 100 that can be used in an arrangement. The example semiconductor device 100 is a Hall current sensor. The semiconductor device 100 includes an isolation barrier 112 that uses galvanic isolation to isolate high voltage signals (signals at voltages from 20V to 100 Volts or higher) from a semiconductor die 105 within the package, and to electrically isolate the high voltage signals (IN+, IN− in FIG. 1C) from low voltage signals (such as logic level voltage signals between 0.5-20 Volts, for example signal VOUT in FIG. 1C) that are coupled to or are output by the semiconductor die 105.

Referring to the device 100 of FIG. 1C, in an example application, an input IN+ can be coupled to a first node and can receive a signal carrying a current labeled "I", for example the node at IN+ may be coupled to a high voltage signal or high voltage supply, and an output IN− can be coupled to a second node, output IN− that outputs the current I. The semiconductor die 105 within semiconductor device package 100 includes at least one Hall element 108. Circuitry needed to control and monitor the Hall element 108 are provided, including a Hall Element Bias circuit 107, a Temperature Compensation and Offset Cancellation circuit 113, a Precision Amplifier 109, and an Output Amplifier 111. Other circuitry to increase device reliability and performance, such as overvoltage, overcurrent, and temperature sensors with corresponding control and output signals, can be provided in semiconductor die 105.

In operation, the output amplifier 111 drives an output VOUT that corresponds to the magnitude of the current I, or which changes voltage with variations in the current I. A magnetic field that occurs due to the current I is sensed by the Hall element 108, and the voltage VOUT corresponding to the magnitude of the magnetic field is output by semiconductor die 105. In a system, a calibration scheme can be used to determine a value of the current I from the voltage that appears at the output VOUT. An isolation barrier 112 is shown, the isolation barrier 112 is formed by use of a package substrate with isolated portions to mount the semiconductor die 105 within a magnetic field that occurs due to current I, while keeping the semiconductor die 105 electrically isolated from the high voltage signals at the input IN+ and the output IN− where the current I is supplied. The semiconductor die 105 can be of a material or materials that cannot withstand the high voltage applied at the terminal IN+, and can be made of silicon and can operate at lower voltages, such as 10 Volts or less. This aspect of the arrangements reduces costs of the Hall current sensor and allows use of conventional semiconductor processing to form the semiconductor die 105. While in the illustrated example of FIG. 1C, a single Hall element 108 is shown, in an alternative arrangement that uses differential sensing by an amplifier similar to precision amplifier 109, two Hall elements spaced apart can be used. This alternative arrangement allows for common noise reduction by using differential sensing to remove common noise sensed by both Hall elements from the output signal. In an example the common noise rejection is achieved by differential sensing to remove noise that appears at both Hall elements.

Figure 2:
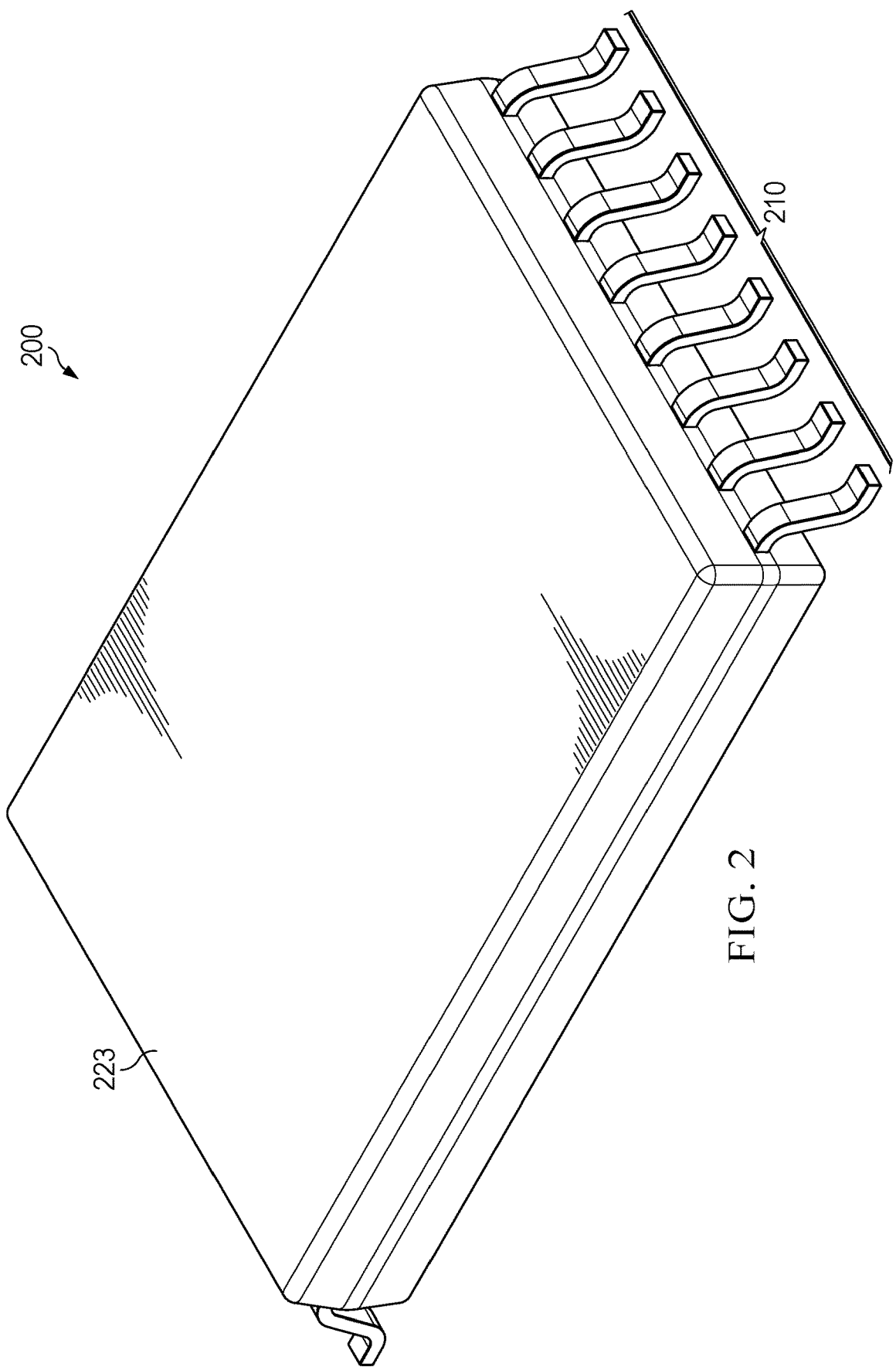
FIG. 2 illustrates, in a projection view a semiconductor device package that can be used with an arrangement.

FIG. 2 illustrates, in a projection view, a semiconductor device package 200 that can be used in an example arrangement. The semiconductor device package has a mold compound 223 that forms the body of the device package, and terminals 210. In FIG. 2, a sixteen-pin wide small outline integrated circuit (SOIC) package 200 is shown. Use of a standard pin out semiconductor device package with the Hall element sensor of the arrangements reduces costs for mounting the devices to a system board or module (as compared to custom packages used in some prior Hall sensor solutions.) In the arrangements, a standard footprint semiconductor device package can be used. While the example SOIC package 200 shown in FIG. 2 includes terminals 210 that are external leads configured for surface mounting to a board using surface mount technology (SMT), no-lead packages such as quad flat no-lead (QFN) packages can also be used. Other standard semiconductor package footprints such as dual in-line packages (DIP) packages can be used. The semiconductor device packages of the example arrangements may be thicker than standard semiconductor device packages due to the use of an integral heat slug, as is explained below, but use of a standard footprint for the packages enables assembly using standard tools and equipment.

FIG. 3 illustrates in a cross-sectional view, an example semiconductor device package 300 incorporating an arrangement. In FIG. 3, a leadframe 307 is used with terminals 310 extending outside the mold compound 323 that forms the package body. Leadframe 307 is an isolation leadframe that includes a high voltage section 3071 and a low voltage section 3072. An internal heat slug 321 is mounted to the board side of the leadframe 307 in the high voltage section 3071 and is formed of a thermal and electrical conductor such as a copper or copper alloy. The heat slug 321 is electrically coupled to the high voltage section 3071 of the leadframe 307 and forms a low resistance current path to carry the current I from an input portion to an output portion (see input and output signals IN+ and IN−, and current I in FIG. 1C) of the high voltage section 3071 of the leadframe 307, and is the heat slug 321 shaped to carry the current I to a position proximate to the semiconductor die 305. From a plan view the heat slug 321 can be a C, U, V, D or similar shape with a portion for carrying current I close to the semiconductor die 305 in the semiconductor device package 300. With the high voltage section 3071 of the leadframe 307, the heat slug 321 forms a serial path from an input (see IN+ in FIG. 1C) to an output (see IN− in FIG. 1C) to conduct current for the signal to be monitored, which can be a high current of greater than an ampere and up to more than 100 Amps. The heat slug 321 can also have an external thermal pad 322 that is exposed from the mold compound 323. Thermal pad 322 is configured to transfer heat from the semiconductor device package 300 to a board or module thermal path to distribute the thermal energy from the semiconductor device package 300 during operations.

The semiconductor device package 300 includes semiconductor die 305 mounted in a "flip chip" orientation with the bond pads and device side surface facing the board side 326 of the semiconductor device package 300. The semiconductor die 305 includes a Hall element (not visible) or more than one that is placed proximate to the heat slug 321, so that a magnetic field corresponding to the current I flowing through the heat slug 321 can be sensed by the Hall element within the semicustom die 305. However, the semiconductor die is electrically isolated from the heat slug 321 and the high voltage section of the leadframe 307.

An electrically insulating layer 317 such as a polyimide or a laminate such as a bismaleimide triazine (BT) resin laminate or glass-reinforced epoxy (FR4) laminate is used to provide electrical isolation between the backside surface of the semiconductor die 305 and a first magnetic shield 313. The first magnetic shield 313 faces the topside 328 of the semiconductor device package 300 and provides a die mounting area spaced from the heat slug 321, to carry the semiconductor die 305. Electrical connections such as bond wires 325 or ribbon bonds, connect bond pads (not shown but see, for example bond pads 102 in FIG. 1B) on the semiconductor die 305 to leads of the low voltage section 3072 of the leadframe 307. A second magnetic shield 315 has a portion that extends in a cantilever fashion to cover the Hall element (not visible) within the semiconductor die 305 so that the Hall element has magnetic shields 315, 313 over the device side surface of the semiconductor die 305 and the backside surface of the semiconductor die 305, to prevent stray magnetic fields from affecting the Hall element within semiconductor die 305 and introducing error to the measurements by the current sensor.

Figure 4A:
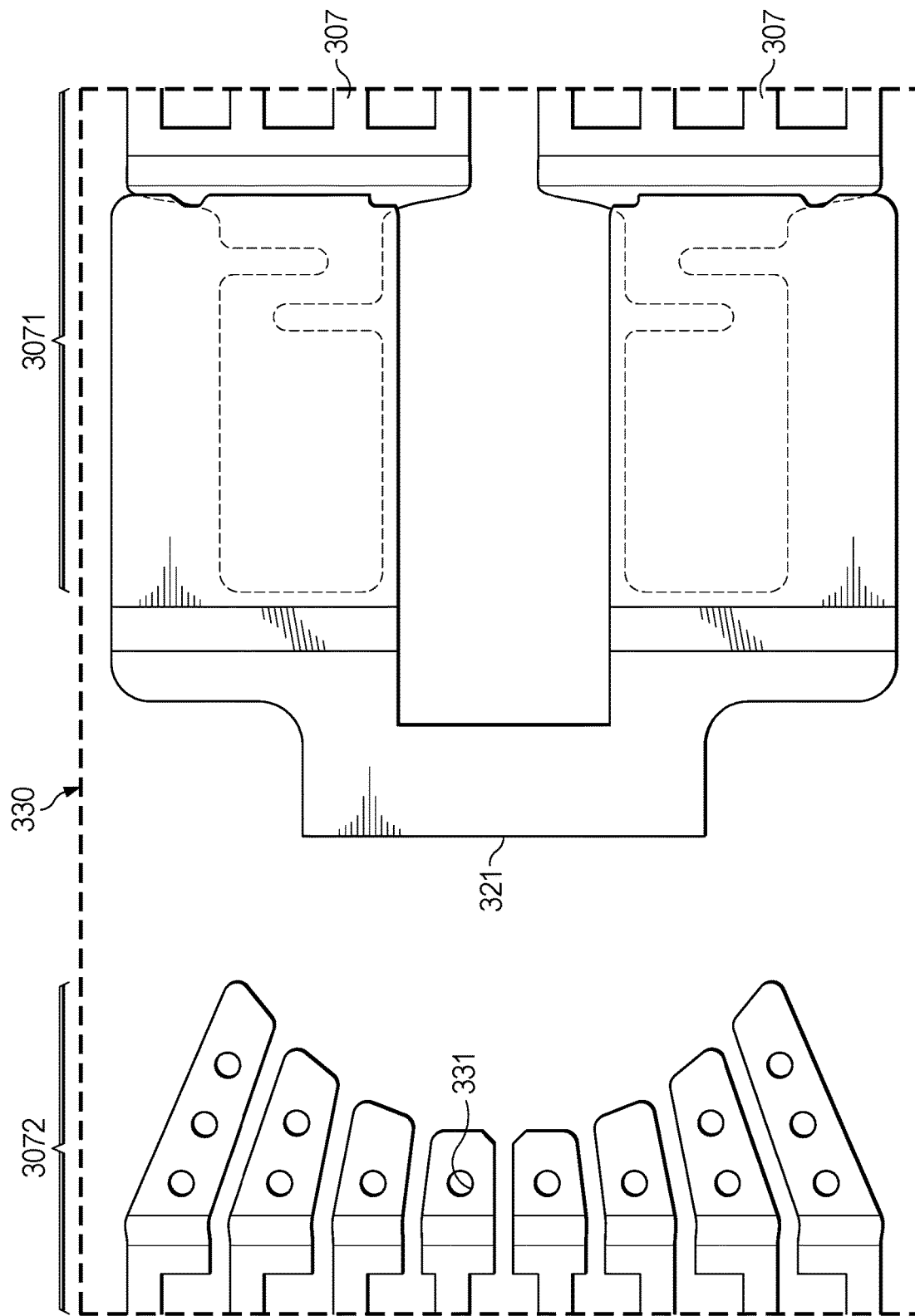
FIGS. 4A-4AA, 4B-4BB, 4C-4CC, 4D-4DDD, 4E-4EE, and 4F illustrate, in a series of plan views and side views, selected steps for forming a semiconductor device package of an example arrangement.

FIGS. 4A-4AA, 4B-4BB, 4C-4CC, 4D-4DDD, 4E-4EE, and 4F illustrate, in a series of plan views and side views, selected steps used to form arrangements. In FIG. 4A, a plan view of a portion 330 of leadframe 307 illustrates an example heat slug 321 mounted on the high voltage section 3071 of the leadframe 307. Leads 331 are shown forming the low voltage section 3072 of the leadframe 307. Note that the leadframe 307 is rotated in FIG. 4A so that the heat slug 321 is facing upwards and is above the leadframe 307, this orientation is used in an assembly step as will be further described below. As mentioned previously, while the heat slug 321 has a "C" shape in the illustrated examples, other shapes can be used for the heat slug 321. The heat slug 321 provides a low resistance path to carry current from the leadframe 307 in the high voltage section 3071 through the heat slug 321. The leadframe portion 330 is the portion of leadframe 307 that is within the package body boundaries, and the external leads (see, for example, 310 in FIG. 3) are not shown in this portion 330. In an example assembly process, the leadframe 307 is provided in a strip, grid or array having multiple unit leadframes that are temporarily connected together by tie bars formed of the leadframe material, and supporting the leads during assembly. Multiple packaged semiconductor devices are formed simultaneously to increase throughput, and reduce costs. The completed packaged devices are then cut apart to form individual semiconductor device packages.

FIG. 4AA is a side view corresponding to the plan view of FIG. 4A, and shows the leadframe 307 with heat slug 321 mounted to it. The heat slug 321 and leadframe 307 can be provided as an assembly by a leadframe vendor, alternatively the heat slug 321 can be mounted to the leadframe 307 in the first part of an assembly process. Heat slug 321 is electrically coupled to the high voltage section 3071 of leadframe 307 and forms a low resistance current conduction path between one or more input terminals and one or more output terminals. Welding or brazing operations can be used to mount the heat slug 321 to the leadframe 307, alternatively solder can be used.

Figure 4B:
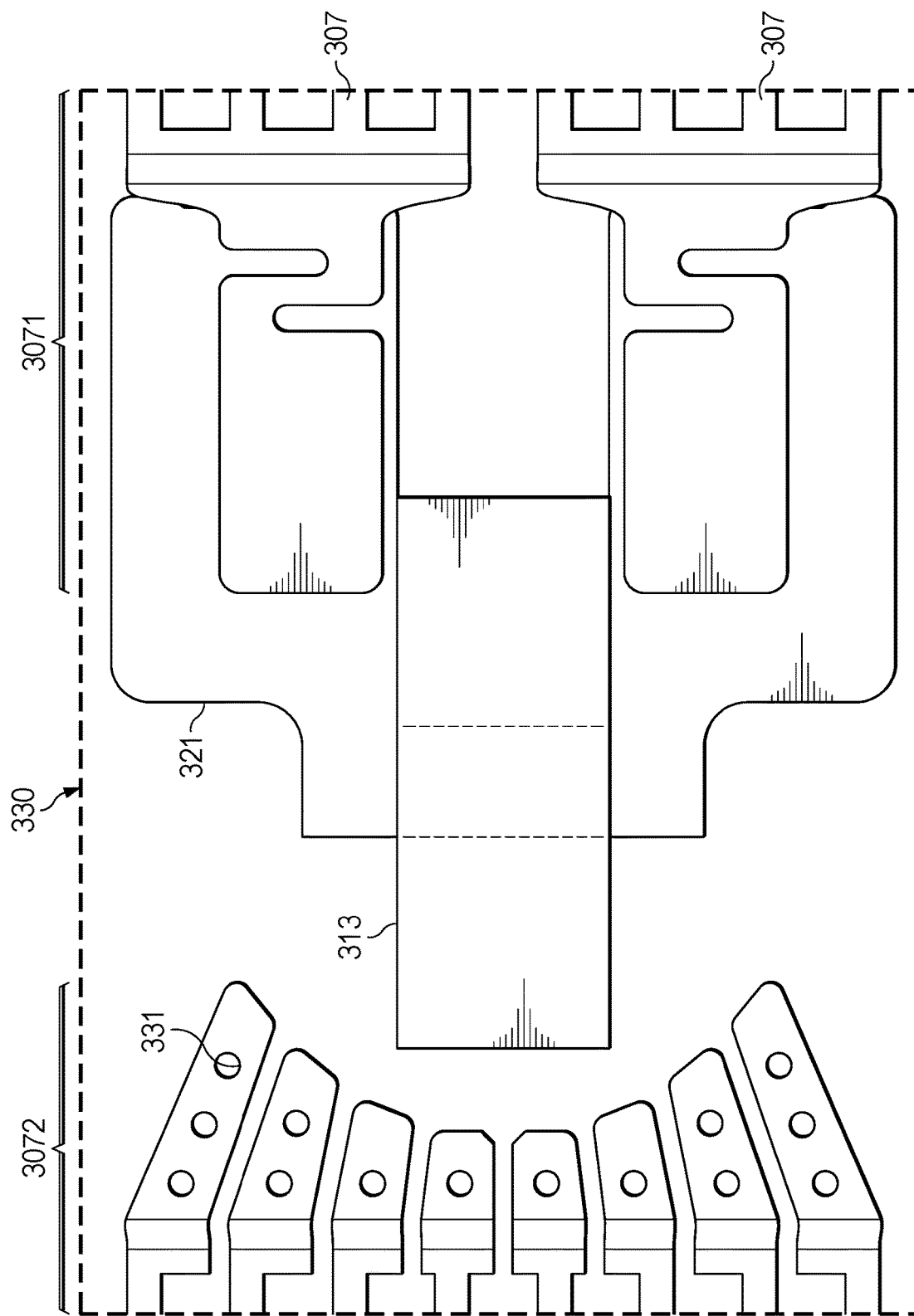
Figure 4B:
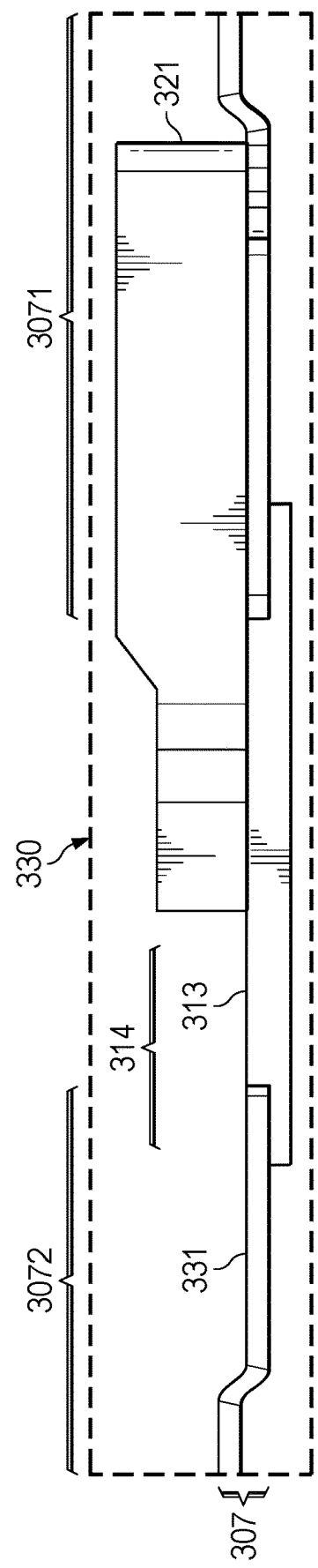

FIG. 4B is a plan view of the leadframe 307 and heat slug 321 of FIGS. 4A-4AA looking from a top side surface, shown after an additional process step. In FIG. 4B, first magnetic shield 313 is mounted to the top or upper side of the heat slug 321. In this example arrangement, the first magnetic shield has an "I" shape from a plan view, and is formed of a magnetic material. Example magnetic materials useful with the arrangements include nickel ferrite, NiFe, nickel zinc ferrite, NiZnFe, and manganese zinc ferrite, MnZnFe. The first magnetic shield 313 is mounted to the heat slug 321 so that a portion of the first magnetic shield 313 extends into an opening in between the heat slug 321 and the low voltage section 3072 of leadframe 307, and provides a die mounting area in the opening spaced from the heat slug 321. In an example process, a die attach film (DAF) (not shown) is used to mount the first magnetic shield to the heat slug 321, alternatives include die attach material that is dispensed as a liquid, paste or gel, and cured. The die attach material is insulating to isolate the first magnetic shield from the other elements.

FIG. 4BB illustrates the first magnetic shield 313, the heat slug 321, and the leadframe 307 of FIG. 4B from a side view with the leadframe assembly rotated with respect to FIG. 4B, so the top side of heat slug 321 is now facing downwards and the first magnetic shield 313 is shown at the bottom of the elements. This orientation is used to show the die mount area 314 of the first magnetic shield 313, which is on the board side of the first magnetic shield 313, and is exposed from the low voltage section 3072 of the leadframe 307, and from the heat slug 321. When the semiconductor device package is mounted to a board, the die mount area 314 will face the board and a semiconductor die mounted to the first magnetic shield 313 will be oriented face down (towards a board surface of the package) or in a flip-chip orientation, as is described below.

Figure 4C:
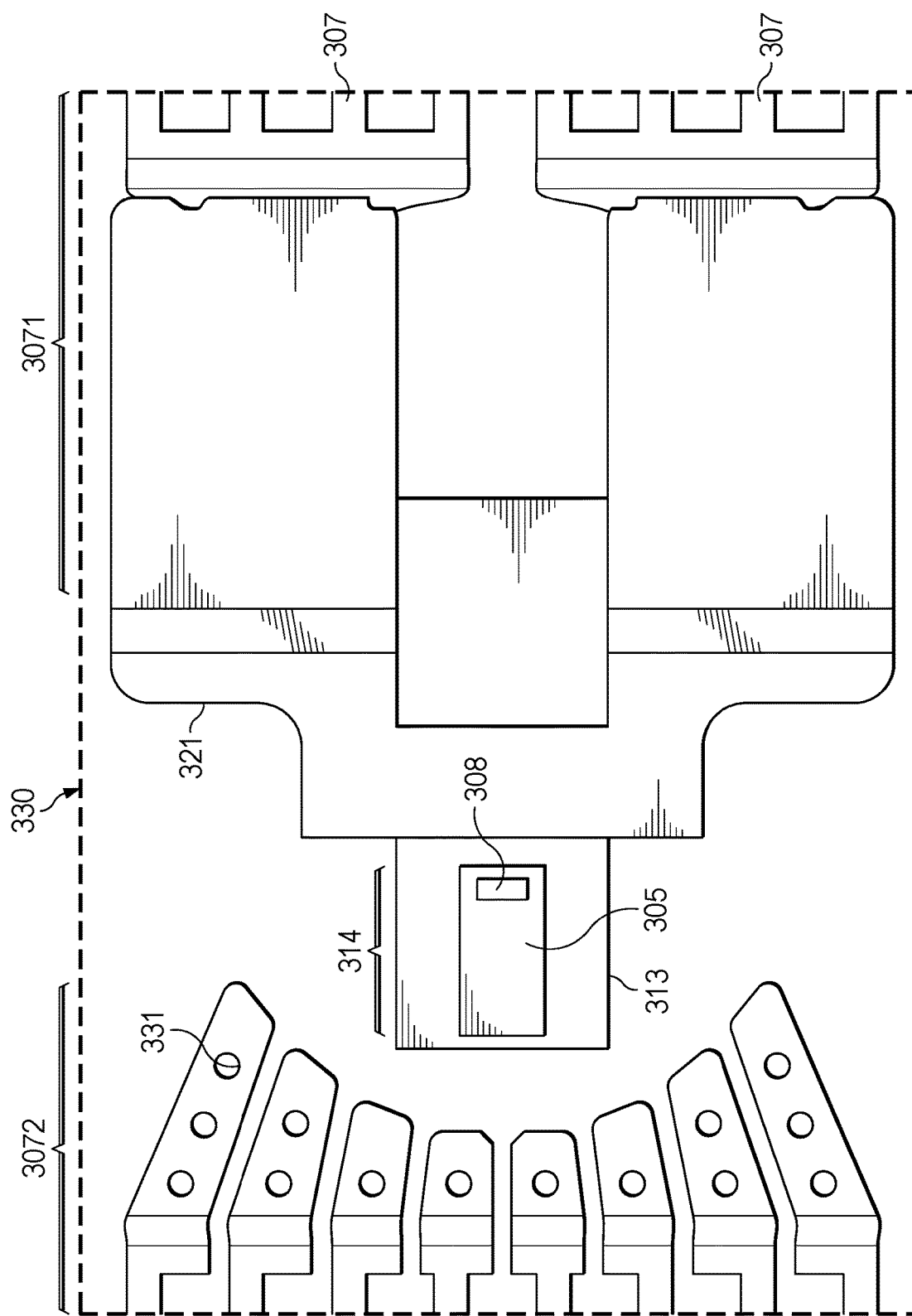
Figure 4C:
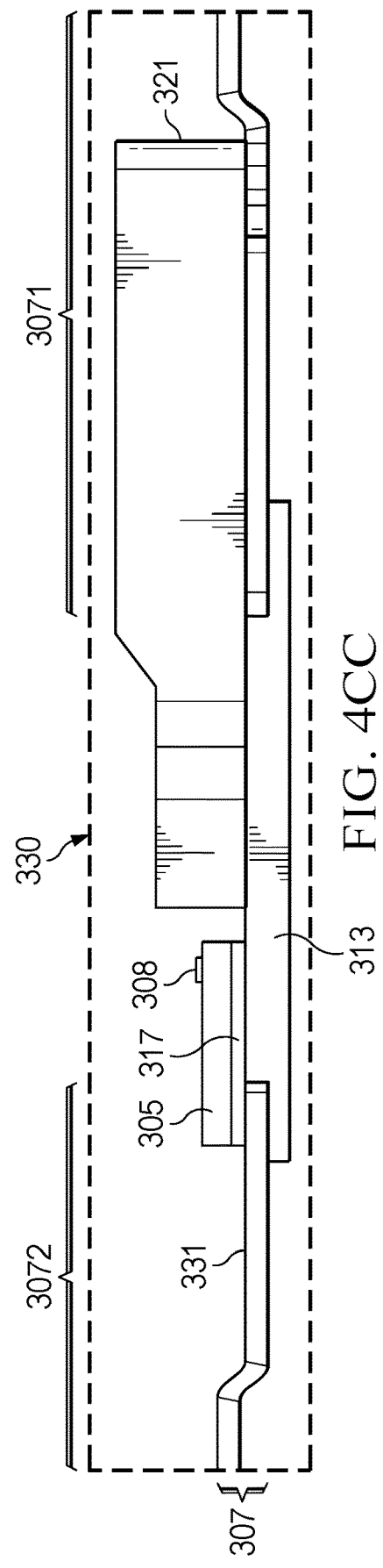

FIG. 4C illustrates, in another plan view, the elements of FIG. 4B after an additional processing step. In FIG. 4C, the leadframe portion 330 is shown looking from the board side, so that the first magnetic shield 313 is shown above the heat slug 321, and the die mount area 314 is shown facing the viewer. A semiconductor die 305, which includes at least one Hall element 308, is shown mounted on the die mount area 314 of the first magnetic shield 313. The semiconductor die 305 is spaced from and electrically isolated from the first magnetic shield 313 by an insulating material that can be a polyimide layer (not visible in FIG. 4C, see the corresponding side view in FIG. 4CC) or an insulating substrate material such as BT resin or FR4. The semiconductor die 305 can be mounted using die attach film (DAF) or die attach material that is dispensed and subsequently cured.

FIG. 4CC is a side view of the elements shown in FIG. 4C. In FIG. 4CC, the elements are shown with the board side of the leadframe 307 facing upwards, so that the heat slug 321 is shown above the leadframe 307. The semiconductor die 305 with the Hall element 308 is shown on die mount area 314 of the first magnetic shield 313. The semiconductor die is spaced from the leads 331 of the low voltage section 3072, and spaced from the heat slug 321 in an opening between these elements. The isolation layer 317, which can be a polyimide layer or a BT resin or FR4 laminate, for example, is shown between the backside surface of the semiconductor die 305 and the first magnetic shield 313. The semiconductor die is therefore electrically isolated from the first magnetic shield 313. The Hall element is proximate to a portion of the heat slug 321, so that in operation a current flowing through the heat slug 321 generates a magnetic field that can be sensed by the Hall element 308.

Figure 4D:
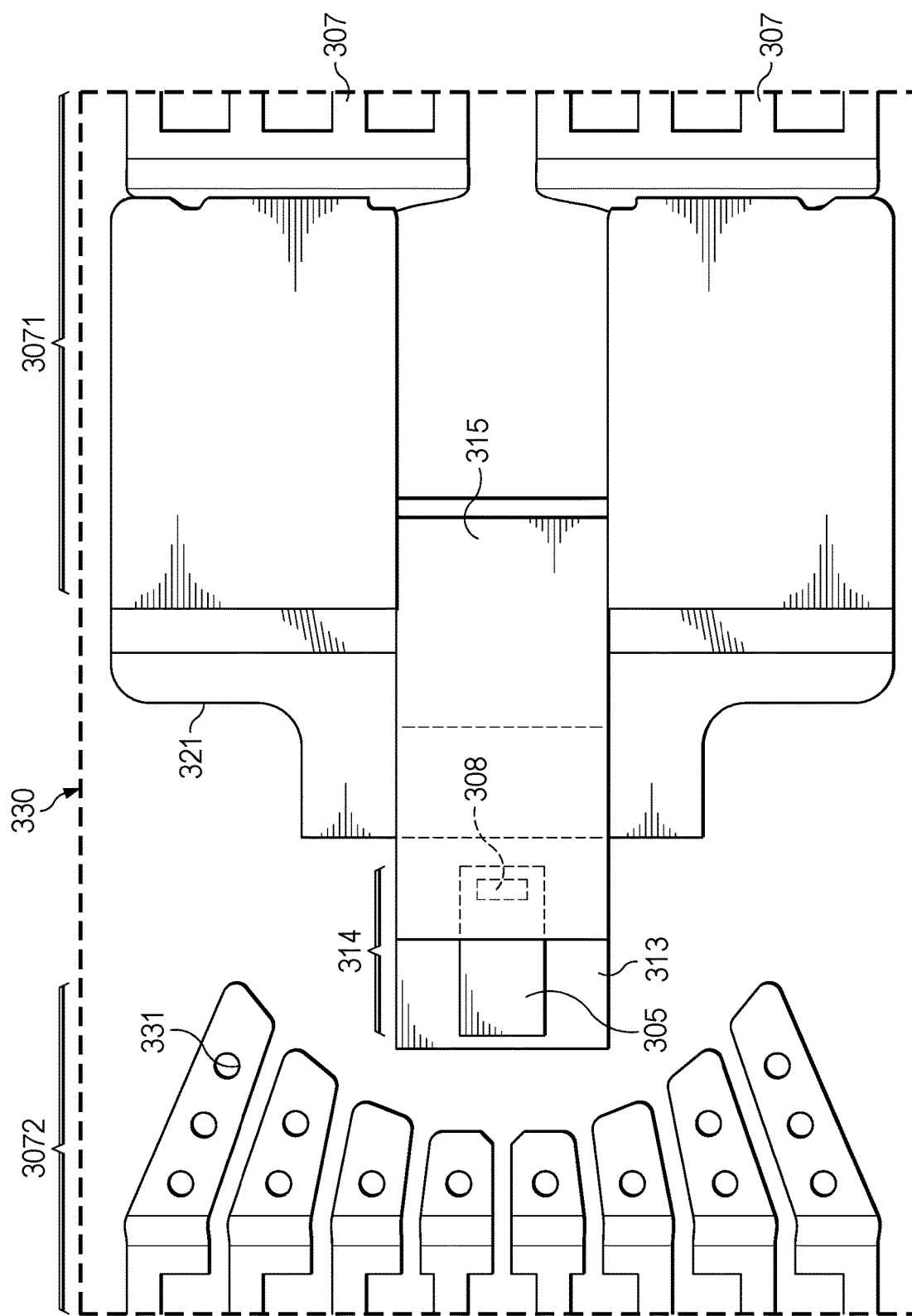
Figure 4D:
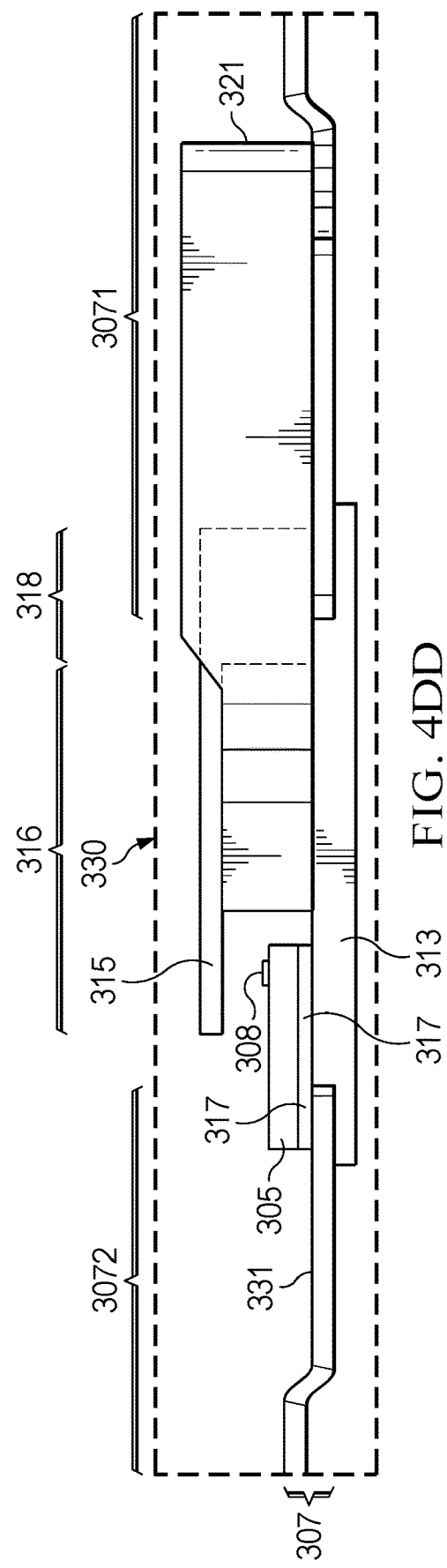

FIG. 4D illustrates, in a plan view looking from the board side of leadframe 307 and heat slug 321, the elements of FIGS. 4C-4CC after an additional processing step. In FIG. 4D, a second magnetic shield 315 is shown mounted to the first magnetic shield 313, and extending over the Hall element 308 on semiconductor die 305, which is mounted to the die mount area 314 of the first magnetic shield 313. The second magnetic shield 315 does not cover the entire device side surface of the semiconductor die 305, this aspect enables a wire bonding operation, shown below, to connect the semiconductor die 305 to leads 331 of the low voltage section 3072 of leadframe 307. The second magnetic shield 315 can be mounted using DAF or die attach material. The second magnetic shield 315 can be mounted to the first magnetic shield, but the semiconductor die 305 is not in electrical or physical contact with the second magnetic shield 315. However, a cantilever portion of the second magnetic shield 315 extends over the device side of the semiconductor die 305, and covers the Hall element 308 within the semiconductor die 305.

FIG. 4DD illustrates, in a side view that corresponds to FIG. 4D, the elements of FIG. 4D including the second magnetic shield 315, in FIG. 4DD the elements are oriented with the board side of the leadframe 307 facing upwards. The second magnetic shield 315 has a base portion 318 and a cantilever portion 316 that, in a cross-sectional view, form an "L" shape. The base portion 318 of the second magnetic shield 315 is mounted on the first magnetic shield 313, for example using DAF or a die attach material, and the cantilever portion 316 of the second magnetic shield 315 extends over a portion of the heat slug 321 and extends over the Hall element 308 on the semiconductor die 305. The first magnetic shield 313 and the second magnetic shield 315 are arranged above and beneath the semiconductor die 305 and provide magnetic shielding for the Hall element 308.

FIG. 4DDD repeats FIG. 4D but adds curve 342, which illustrates in a dashed arrow the path of a current flowing through the heat slug 321. The current is from a signal labeled "$I_{INPUT}$" coupled to an input terminal formed of the high voltage section 3071 of leadframe 307, which is coupled to the heat slug 321 and an output terminal of the high voltage section 3071 of leadframe 307 to form a current path for the current 342, which flows to the output terminal as a signal labeled "$I_{OUTPUT}$". In operation, the current 342 will flow through the heat slug 321 in a position proximate to the Hall element 308 on semiconductor die 305, and the Hall element will sense a magnetic field that is caused by and is proportional to the current 342. The first magnetic shield 313 and the second magnetic shield 315 are positioned above and below the semiconductor die 305 and shield the Hall element 308 from stray magnetic fields, reducing error.

Figure 4E:
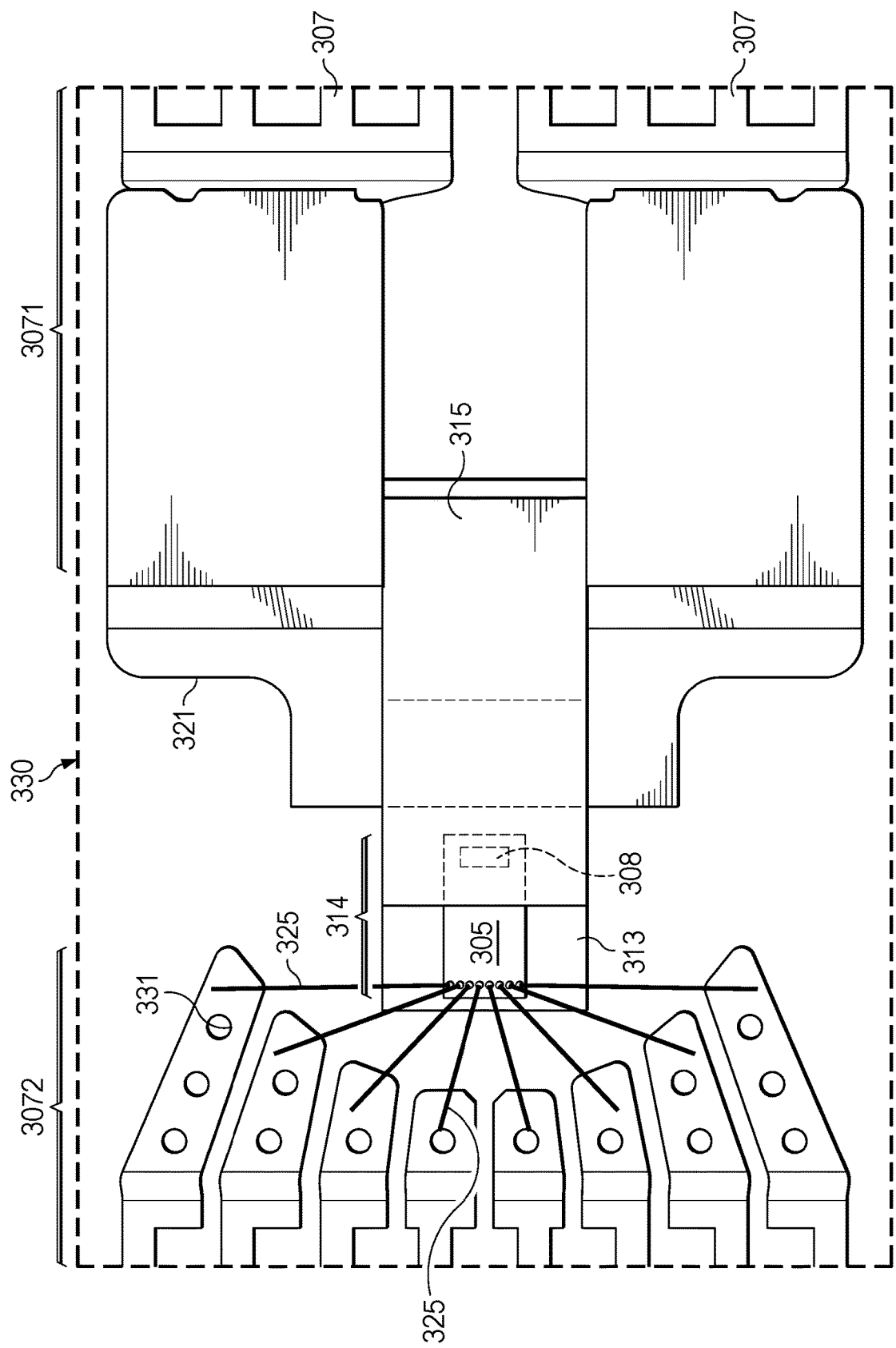
Figure 4E:
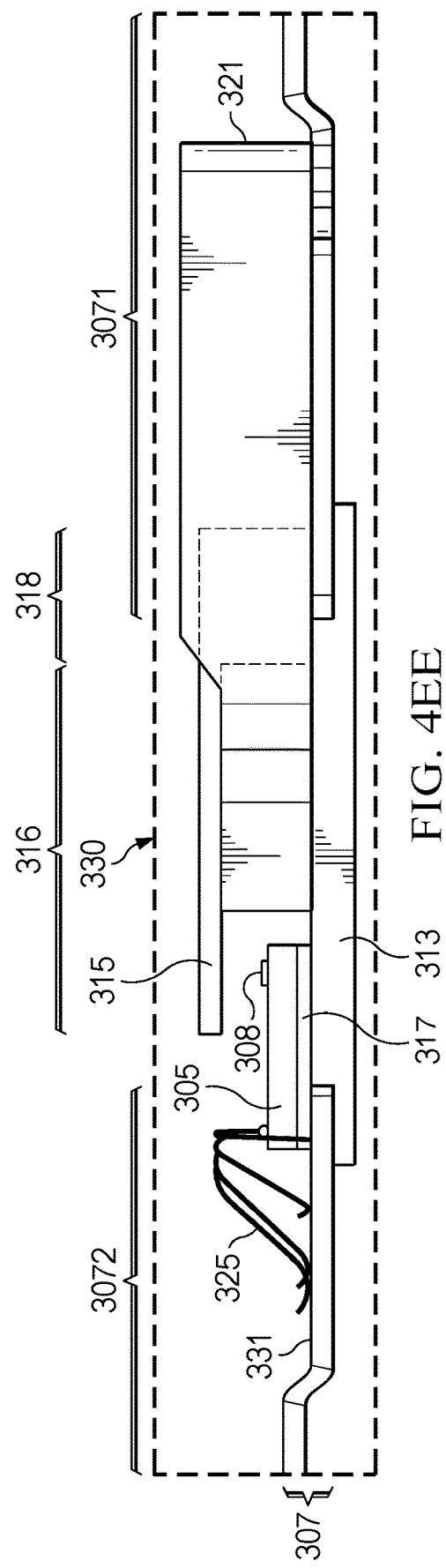

FIG. 4E illustrates, in a plan view, the elements of FIG. 4D after an additional processing step. In FIG. 4E, the view is looking from a board side of the leadframe 307 at the device side surface of the semiconductor die 305. In FIG. 4E, the semiconductor die 305 is shown with electrical connections such as bond wires 325 formed to leads 331 of the low voltage section 3072 of leadframe 307. The electrical connections can be formed using a ball bond process, such as a ball and stitch wire bonding tool. Alternatively, ribbon bonds can be used to couple semiconductor die 305 to the leads 331.

In an example ball and stitch wire bonding process, a capillary with a bond wire extending through an opening is used. A flame or electronic arc can be used to form a ball at the end of the extended bond wire. The capillary uses mechanical force, and sonic vibration, to push the molten ball onto a conductive bond pad on the semiconductor die, and form a ball bond between the bond wire and the bond pad. As the capillary moves away from the bond pad, the bond wire is allowed to extend from the ball bond in an arc shape. The capillary moves over a lead, and a stitch bond is formed by using mechanical force and sonic vibration energy to push the bond wire onto the lead. The capillary moves a short distance from the stitch bond and the bond wire is cut, leaving a small tail. This ball and stitch operation is automated and rapid, and many wire bonds can be formed in a few seconds, allowing rapid throughput. Copper, gold, silver, and aluminum bond wires can be used. In an example process, copper bond wires are used. When copper is used, an anoxic atmosphere can be used in the wire bonding tool to reduce oxidation of the copper bond wires.

FIG. 4EE illustrates the elements of FIG. 4E in a side view. In FIG. 4E, the elements are shown oriented with the board side of the leadframe 307 facing upwards. Bond wires 325 are shown between bond pads (not visible) on semiconductor die 305 and the leads 331 of the low voltage section 3072 of the leadframe 307. The second magnetic shield 315 is shown with base 318 and with the cantilever portion 316 extending over but not covering the device side surface of the semiconductor die 305, to allow a wire bonder to reach the bond pads for the wire bonding processes. Hall element 308 has the second magnetic shield 315 over it, and the first magnetic shield 313 is beneath it (as the elements are oriented in FIG. 4EE, that is, with the board side facing upwards), providing magnetic shielding from stray magnetic fields.

Figure 4F:
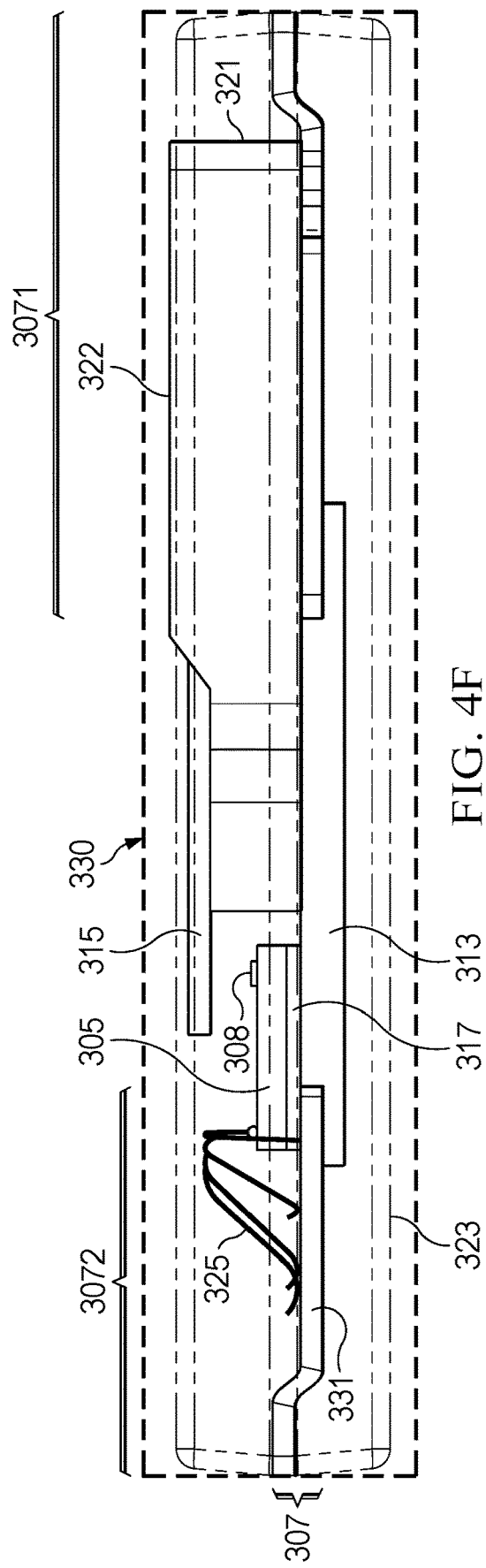

FIG. 4F illustrates, in a side view, the elements of FIG. 4E after a molding process forms a package body from mold compound 323. The mold compound 323 is shown in a transparent view to expose the other elements. The portion 330 of the leadframe 307 of FIG. 4E is shown with the leadframe 307 and the other elements oriented so the board side of the leadframe 307 is facing upwards. Mold compound 323 is shown formed over the semiconductor die 305, the first magnetic shield 313, the second magnetic shield 315, portions of the leads 331 of the low voltage section 3072 of the leadframe 307, and portions of the high voltage section 3071 of the leadframe 307, and covering most of the heat slug 321 while a board side surface of the heat slug 321 is exposed from the mold compound 323 to form thermal pad 322. In an example transfer molding process, the leadframe 303 as shown in FIG. 4E after wire bonding is placed in a mold chase. Electronic mold compound (EMC) can be used as mold compound 323, which can be molded starting from a solid puck or a solid powder at room temperature that is placed in the mold tool and heated to a liquid state. In an example, an epoxy resin mold compound with solid fillers is used, the fillers add strength and thermal dissipation to the mold compound. After the mold compound becomes liquid, a mechanical ram is used to force the mold compound through runners into the mold chase and the mold compound surrounds the leadframe 307 and the other elements, with portions of the leads extending from the mold compound to form terminals, and thermal pads exposed from the mold compound. The mold compound is cured and becomes a solid, the mold compound 323 is a thermoset material and will remain solid after molding to protect the elements of the semiconductor device package.

Figure 5:
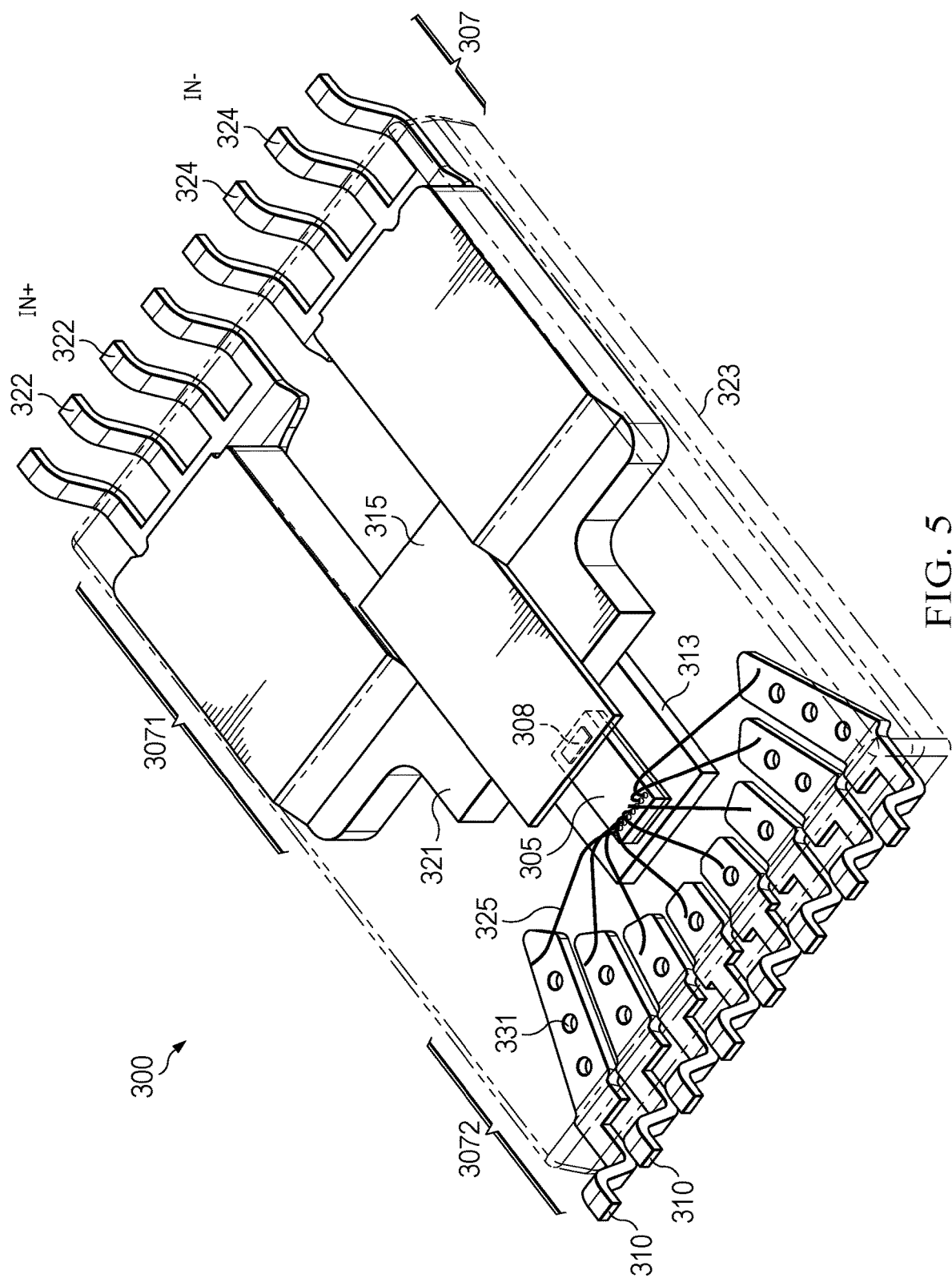
FIG. 5 illustrates, in a projection view from a board side, an example semiconductor device package of an arrangement.

FIG. 5 illustrates, in a projection view, the completed semiconductor device package 300 looking from the board side. In FIG. 5, the semiconductor die 305 is shown mounted to the first magnetic shield with the Hall element 308 placed proximate to a portion of the heat slug 321. The low voltage section 3072 of the leadframe 307 is shown with the leads 331 extending from mold compound 323 to form terminals 310. The high voltage section 3071 of the leadframe 308 is shown with leads extending from the mold compound 323 to form terminals 332, 334 for the high voltage signals (at terminals 332, (IN+)) (and at terminals 334 (IN−)). Heat slug 321 is shown with the second magnetic shield 315 mounted so that a cantilever portion of the second magnetic shield extends over the Hall element 308 of the semiconductor die 305. Wire bonds 325 are shown between the semiconductor die 305 and the leads 331 of the leadframe 307. The high voltage section 3071 of the leadframe is connected to and electrically coupled to the heat slug 321, to provide a current path (see 342 in FIG. 4DDD) from the IN+ terminals 332 to the IN− terminals 334 through the heat slug 321. The semiconductor die 305 is positioned between the first magnetic shield 313 and the second magnetic shield 315 so that the Hall element 308 has a magnetic shield above and beneath it.

The example semiconductor device package 300 shown in FIG. 5 and FIG. 3 is a wide SOIC package with sixteen terminals, however, the first magnetic shield and the second magnetic shield can be used with Hall sensor semiconductor devices and with package substrates in other package types, such as no-lead packages, and packages of various widths, to form a Hall current sensor in a standard package footprint. The use of the heat slug in the arrangements can cause the completed semiconductor device package 300 to have a thickness that is greater than a standard package thickness, however the board layout needed to mount the package can still be in a standard package footprint, lowering costs of board design and simplifying assembly.

Figure 6:
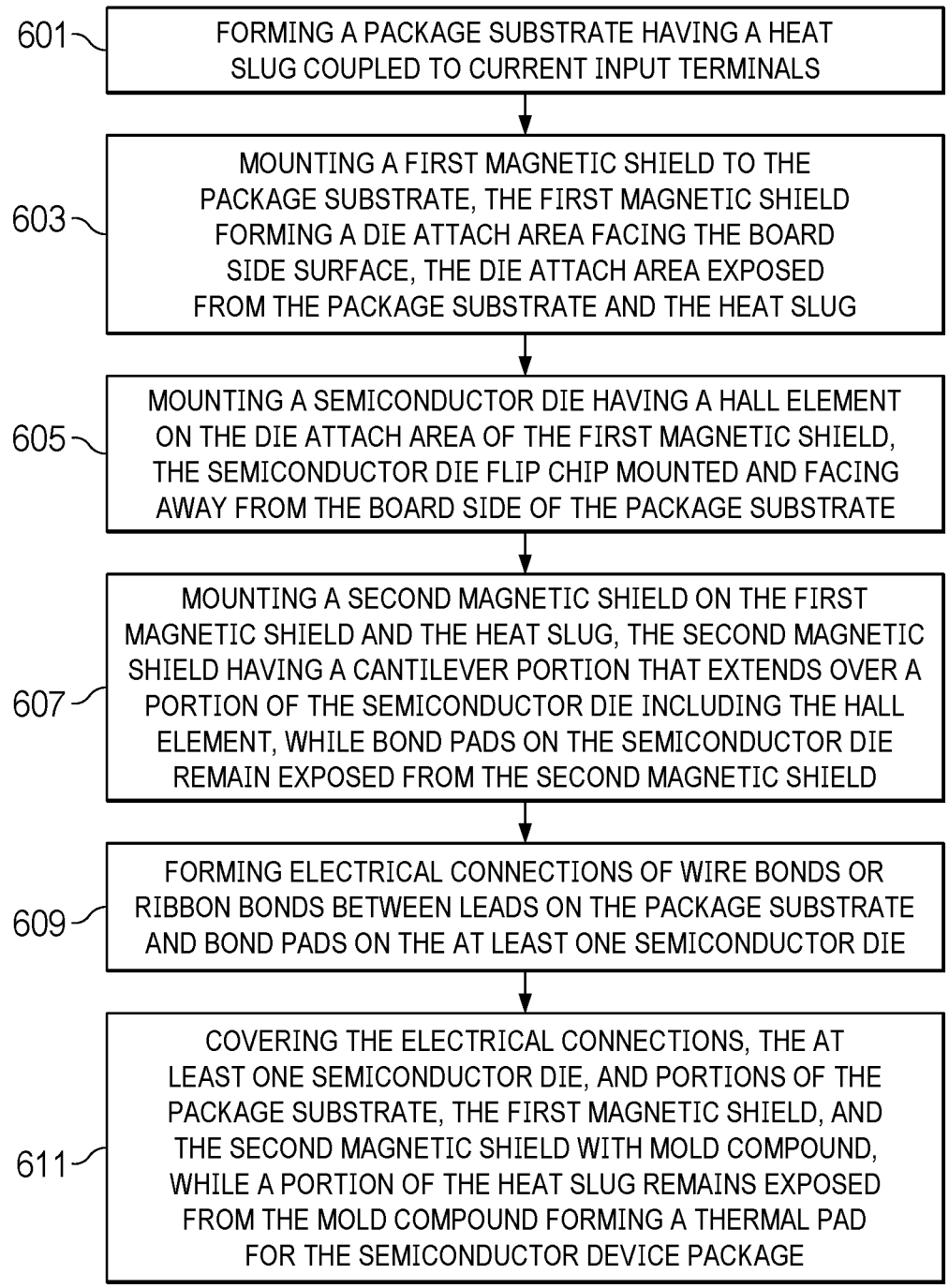
FIG. 6 illustrates, in a flow diagram, an example method for forming an arrangement.

FIG. 6 illustrates, in a flow diagrams, steps for forming a semiconductor device package of the arrangements.

In FIG. 6, at step 601, the method begins by forming a package substrate having a board side surface and an opposite top surface, and having a heat slug coupled to the package substrate, the heat slug configured to conduct a current between terminals of the package substrate. (See, for example, FIG. 4A and FIG. 4AA, heat slug 321 and the package substrate, leadframe 307.)

At step 603, the method continues by mounting a first magnetic shield to the package substrate, the first magnetic shield including a die attach area facing the board side surface, the die attach area exposed from the package substrate and the heat slug. (See, for example, FIG. 4B and FIG. 4BB, with first magnetic shield 313 mounted to the package substrate, leadframe 307).

At step 605, the method continues by mounting a semiconductor die having a Hall element on the die attach area, the semiconductor die flip chip mounted and facing away from the board side surface of the package substrate. (See, for example, semiconductor die 305 and Hall element 308, in FIGS. 4C-4CC).

At step 607, the method continues by mounting a second magnetic shield to the package substrate and the heat slug, the second magnetic shield having a cantilever portion that extends over a portion of the semiconductor die including the Hall element, while bond pads on the semiconductor die remain exposed from the second magnetic shield. (See, for example, FIGS. 4D-4DDD, with second magnetic shield 315 mounted on leadframe 307).

At step 609, the method continues by forming electrical connections of wire bonds or ribbon bonds between bond pads of the semiconductor die and leads on the package substrate. (See, for example, FIGS. 4E-4EE, with wire bonds 325).

At step 611, the method ends by covering the electrical connections, the at least one semiconductor die, and portions of the package substrate, the first magnetic shield, and the second magnetic shield with mold compound, while a portion of the heat slug remains exposed from the mold compound forming a thermal pad for the semiconductor device package. (See mold compound 323 in FIG. 4F, for example).

The use of the arrangements provides a packaged semiconductor device including one or more Hall sensors with integral magnetic shields. The packaged semiconductor devices are current sensors configured for high power or high current applications such as currents of greater than an Ampere and up to 100 Amperes or higher. The arrangements are formed using existing methods, materials and tooling for making the devices and are cost effective. The magnetic shields are formed of magnetic materials that are readily available. By providing the magnetic shields integral to the semiconductor package and positioned over the semiconductor device die, using materials that are compatible with typical semiconductor packaging processes and methods, the use of the arrangements provides an economical and robust integrated Hall current sensor device for high power applications. The packaged semiconductor devices can be used with a variety of semiconductor package types, including leaded, SOIC, and no-lead packages including QFN and SON packages.

Modifications are possible in the described arrangements, and other alternative arrangements are possible within the scope of the claims.

What is claimed is:

1. A method of forming a semiconductor device package, comprising:
   forming a package substrate having a board side surface and an opposite top surface, and having a heat slug coupled to the package substrate, the heat slug configured to conduct a current between terminals of the package substrate;
   mounting a first magnetic shield to the package substrate, the first magnetic shield comprising a die mount area facing the board side surface, the die mount area exposed from the package substrate and the heat slug;
   mounting a semiconductor die having a Hall element on the die mount area, the semiconductor die flip chip mounted and facing away from the board side surface of the package substrate;
   mounting a second magnetic shield to the package substrate and the heat slug, the second magnetic shield having a cantilever portion that extends over a portion of the semiconductor die including the Hall element, while bond pads on the semiconductor die remain exposed from the second magnetic shield;
   forming electrical connections of wire bonds or ribbon bonds between the bond pads of the semiconductor die and leads on the package substrate; and
   covering the electrical connections, the semiconductor die, and portions of the package substrate, the first magnetic shield, and the second magnetic shield with mold compound, while a portion of the heat slug is exposed from the mold compound forming a thermal pad for the semiconductor device package.

2. The method of claim 1, wherein mounting the semiconductor die having the Hall element on the die attach area further comprises forming an insulating layer on the die attach area prior to mounting the semiconductor device die.

3. The method of claim 2, wherein the insulating layer is a polyimide.

4. The method of claim 2, wherein the insulating layer is a bismaleimide triazine (BT) resin laminate or a glass-reinforced epoxy (FR4) laminate.

5. The method of claim 1, wherein the first magnetic shield comprises a magnetic material.

6. The method of claim 5, wherein the magnetic material is nickel ferrite (NiFe), nickel zinc ferrite (NiZnFe), or manganese zinc ferrite (MnZnFe).

7. The method of claim 1, wherein the first magnetic shield has an "I" shape in a plan view.

8. The method of claim 1, wherein the second magnetic shield has a rectangular base and the cantilever portion extending from the rectangular base.

9. The method of claim 8, wherein the second magnetic shield has an "L" shape in a cross-sectional view.

10. The method of claim 1, wherein the heat slug is copper or copper alloy.

11. The method of claim 1, wherein the package substrate is an isolation leadframe having a high voltage section with a first set of terminals coupled to the heat slug, and a low voltage section with a second set of terminals spaced from and electrically isolated from the high voltage section.

12. The method of claim 11, wherein the isolation leadframe is copper, aluminum, stainless steel, steel, or alloys thereof.

13. The method of claim 12, wherein the isolation leadframe is copper or copper alloy.

14. An apparatus, comprising:
- a package substrate having a board side surface and an opposite top surface, and a heat slug coupled to the package substrate, the heat slug configured to conduct a current between terminals of the package substrate;
- a first magnetic shield mounted to the top surface of the package substrate, the first magnetic shield comprising a die mount area facing the board side surface, the die mount area in an opening exposed from the package substrate and the heat slug;
- a semiconductor die having a Hall element mounted to the die mount area, the semiconductor die flip chip mounted and facing away from the board side surface of the package substrate;
- a second magnetic shield mounted to the package substrate and the heat slug, the second magnetic shield having a base portion and having a cantilever portion extending over a portion of the semiconductor die including the Hall element, while bond pads on the semiconductor die remain exposed from the second magnetic shield;
- electrical connections of wire bonds or ribbon bonds between bond pads of the semiconductor die and leads on the package substrate; and
- mold compound covering the electrical connections, the semiconductor die, portions of the package substrate, the first magnetic shield, and the second magnetic shield, while a portion of the heat slug is exposed from the mold compound forming a thermal pad for a semiconductor device package.

15. The apparatus of claim 14, wherein the first magnetic shield and the second magnetic shield are of magnetic material.

16. The apparatus of claim 15, wherein the magnetic material comprises nickel ferrite (NiFe), nickel zinc ferrite (NiZnFe), or manganese zinc ferrite (MnZnFe).

17. The apparatus of claim 14, wherein the package substrate comprises a leadframe with a first set of leads in a high voltage section coupled to the heat slug, and a second set of leads in a low voltage section coupled to the semiconductor die by the electrical connections.

18. The apparatus of claim 17, wherein the first set of leads of the high voltage section of the leadframe and the heat slug are configured to carry a current to a portion of the heat slug that is proximate to the Hall sensor on the semiconductor die.

19. A Hall current sensor device, comprising:
- a leadframe having a first set of leads in a high voltage section and second set of leads in a low voltage section electrically isolated from the high voltage section, the leadframe having a board side surface and an opposite top surface;
- a heat slug coupled to the first set of leads of the high voltage section, the heat slug configured to conduct a current between terminals formed from the first set of leads of the high voltage section;
- a first magnetic shield mounted to the top surface of the leadframe and comprising a die mount area in an opening exposed from the leadframe and from the heat slug;
- a semiconductor die having a Hall element mounted to the die mount area, the semiconductor die flip chip mounted and facing away from the board side surface of the leadframe;
- a second magnetic shield mounted to the heat slug, the second magnetic shield having a base portion and having a cantilever portion extending over a portion of the semiconductor die including the Hall element, while bond pads on the semiconductor die remain exposed from the second magnetic shield;
- electrical connections comprising wire bonds or ribbon bonds between the bond pads of the semiconductor die and the second set of leads on the low voltage section of the leadframe; and
- mold compound covering the electrical connections, the semiconductor die, portions of the leadframe, the first magnetic shield, and the second magnetic shield, while a portion of the heat slug is exposed from the mold compound forming a thermal pad for a semiconductor device package.

20. The Hall current sensor device of claim 19, wherein the first magnetic shield and the second magnetic shield comprise nickel ferrite (NiFe), nickel zinc ferrite (NiZnFe), or manganese zinc ferrite (MnZnFe).

* * * * *